(12) United States Patent
Baldwin et al.

(10) Patent No.: US 11,837,824 B2
(45) Date of Patent: *Dec. 5, 2023

(54) SYSTEMS, METHODS, AND APPARATUS USEFUL FOR BUSWAY POWER DISTRIBUTION

(71) Applicant: BUSWAY SOLUTIONS, LLC, Laurel, MD (US)

(72) Inventors: Mark H. Baldwin, Laurel, MD (US); Eric N. Shatzer, Highland, MD (US)

(73) Assignee: BUSWAY SOLUTIONS, LLC, Laurel, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/127,207

(22) Filed: Sep. 10, 2018

(65) Prior Publication Data
US 2019/0097399 A1    Mar. 28, 2019

Related U.S. Application Data

(63) Continuation-in-part of application No. 15/185,816, filed on Jun. 17, 2016, now Pat. No. 10,122,161.
(Continued)

(51) Int. Cl.
| | |
|---|---|
| *H01R 25/14* | (2006.01) |
| *H01R 13/22* | (2006.01) |
| *H02G 3/08* | (2006.01) |
| *H02G 3/10* | (2006.01) |
| *H02G 5/08* | (2006.01) |
| *G01K 1/14* | (2021.01) |
| *G01K 7/02* | (2021.01) |

(Continued)

(52) U.S. Cl.
CPC ............ *H01R 25/142* (2013.01); *G01K 1/14* (2013.01); *G01K 7/02* (2013.01); *H01R 25/00* (2013.01); *H02B 1/26* (2013.01); *H02B 1/56* (2013.01); *H05K 7/20909* (2013.01); *G08C 17/02* (2013.01); *H01R 13/22* (2013.01); *H01R 13/6683* (2013.01); *H02G 3/08* (2013.01); *H02G 3/105* (2013.01); *H02G 5/08* (2013.01); *H02G 5/10* (2013.01); *H04Q 2209/43* (2013.01)

(58) Field of Classification Search
CPC .. H02G 5/06; H02G 5/08; H02G 5/10; H02G 3/105; H01R 25/14; H01R 25/142; H01R 25/00; H01R 13/6683; G01K 7/02; G01K 1/14; H02B 1/20; H02B 1/56; H02B 1/26; H05K 7/20909; G08C 17/02; H04Q 2209/43

See application file for complete search history.

(56) References Cited

U.S. PATENT DOCUMENTS

| | | | | |
|---|---|---|---|---|
| 7,819,676 | B1 * | 10/2010 | Cardoso | H01R 13/245 |
| | | | | 439/115 |
| 8,339,772 | B2 * | 12/2012 | Peralta | H02G 5/10 |
| | | | | 174/16.2 |

(Continued)

FOREIGN PATENT DOCUMENTS

GB    2275533 A  *  8/1994  ............... G01B 7/22

*Primary Examiner* — Zachary Pape
(74) *Attorney, Agent, or Firm* — CASTELLANO; Richard A. Castellano

(57) ABSTRACT

A tap-off box includes an enclosure defining a plurality of stab slots and defining a wire access opening, and a thermocouple disposed therein. The tap-off box is configured for remote control and monitoring.

6 Claims, 23 Drawing Sheets

Related U.S. Application Data

(60) Provisional application No. 62/180,966, filed on Jun. 17, 2015.

(51) Int. Cl.
    *H01R 25/00*    (2006.01)
    *H02B 1/26*     (2006.01)
    *H05K 7/20*     (2006.01)
    *H02B 1/56*     (2006.01)
    G08C 17/02   (2006.01)
    H02G 5/10    (2006.01)
    H02G 5/04    (2006.01)
    H01R 13/66   (2006.01)

(56) References Cited

U.S. PATENT DOCUMENTS

| | | | | |
|---|---|---|---|---|
| 9,083,158 | B2* | 7/2015 | Bulmer | H02B 1/28 |
| 9,437,387 | B1* | 9/2016 | Kaplan | H05K 7/1492 |
| 10,122,161 | B2* | 11/2018 | Baldwin | H02G 5/06 |
| 10,285,301 | B1* | 5/2019 | Bailey | H05K 7/1497 |
| 2015/0236462 | A1* | 8/2015 | Davidson, Jr. | H01R 25/142 |
| | | | | 439/122 |

* cited by examiner

CONTACTOR TABULATION

| ANG | MARK | COLOR | "X" DRILL | "Y" DIM | "Z" REF | "W" DIA | "C" DIA |
|---|---|---|---|---|---|---|---|
| 10 | A | RED | ⌀ 1/8 (.125) | .216 | .298 | .164 | .102-.116 |
|  | B | WHITE |  |  |  |  |  |
|  | C | BLUE |  |  |  |  |  |
|  | D | BLACK |  |  |  |  |  |
| 8 | E | RED | ⌀ 5/32 (.156) | .190 | .298 | .216 | .128-.146 |
|  | F | WHITE |  |  |  |  |  |
|  | G | BLUE |  |  |  |  |  |
|  | H | BLACK |  |  |  |  |  |
| 6 | J | RED | ⌀ 3/16 (.188) | .171 | .298 | .254 | .162-.184 |
|  | K | WHITE |  |  |  |  |  |
|  | L | BLUE |  |  |  |  |  |
|  | M | BLACK |  |  |  |  |  |
| 4 | N | RED | ⌀ 15/64 (.234) | .162 | .324 | .324 | .204-.232 |
|  | P | WHITE |  |  |  |  |  |
|  | Q | BLUE |  |  |  |  |  |
|  | R | BLACK |  |  |  |  |  |
| 10 | S | GREEN (GROUND) | ⌀ 1/8 (.216) | .216 | .216 | .164 | .102-.116 |

FIG. 5

SYSTEMS, METHODS, AND APPARATUS USEFUL FOR BUSWAY POWER DISTRIBUTION

RELATED APPLICATIONS

This application claims the benefit of priority to U.S. Provisional Patent Application No. 62/180,966, titled SYSTEMS, METHODS, AND APPARATUS USEFUL FOR BUSWAY POWER DISTRIBUTION, filed Jun. 17, 2015, the disclosure of which is hereby incorporated by reference herein in its entirety. This application is a continuation-in-part of U.S. Non-Provisional patent application Ser. No. 15/185,816, titled SYSTEMS, METHODS, AND APPARATUS USEFUL FOR BUSWAY POWER DISTRIBUTION, filed Jun. 17, 2016, the disclosure of which is hereby incorporated by reference herein in its entirety.

BACKGROUND

1. Field

The disclosure relates to systems, methods, and apparatus for electrical power distributions systems. In particular, the disclosure relates to take-off devices, such as power heads, for use with busbar busway power delivery systems.

2. Introduction

Electrical power distribution systems are useful for providing flexible power delivery options in a broad range of operating environments, including offices, warehouses, garages, and factories to provide an electrical power source for lighting and other electrical devices and equipment. In particular, busway distribution systems must be developed to accommodate structural features and clearance requirements imposed by the workspaces and equipment, raceways, piping, and encumbrances present in the environments for which they are most useful. For example, busbar busway power distribution systems are widely used for powering computer systems in large data centers, and they continue to gain popularity for their growing omnipresence, ease of installation, and ease of custom configuration and re-configuration.

Busway systems include one or more tracks or sections that each contains electrically isolated conductive bars called busbars that extend along an inner length of a track housing of a busway frame and enclosure commonly known as "open channel busway." The housing may be constructed of extruded aluminum, for example, and provide a ground that meets applicable standards, and may have a withstand rating of at least 22 kA, for example. Preferably, busbar busway power distribution systems are capable of operating continuously without mechanical or electrical damage, degradation, or derating of operating capability under the following example conditions: 1) ambient temperature of electronic components in range from 32 degrees to 104 degrees Fahrenheit (0 degrees to 40 degrees Celsius); 2) relative humidity of 0 percent to 90 percent, non-condensing; and 3) altitude in a range from sea level to 4000 feet (1220 m). Preferably busways should meet UL857, be configured to supply rated full-load current; should be rated to 600 VAC and 600 VDC; and should be fully rated to interrupt symmetrical short-circuit current with a minimum three-cycle short-circuit rating of up to 42Ka RMS symmetrical. The housing defines an opening or channel that enables access to the busbar contained within the housing. Open channel busway tracks or sections may be joined together to form power distribution circuits.

Busway housing section lengths may be custom defined for a particular application. Busway systems have been developed for side and overhead installation of track sections to a wall or ceiling, respectively, to accommodate a variety or installation options and application limitations imposed by equipment or installation environments. A top of a busway track or section may include or define a slot or channel running along a length of the busway to provide attachment points for installation of the busway in an operating environment. An opposing side or bottom of the busway track may include or define a conductor access opening, which may be a continuous or substantially continuous opening extending along a length of the track or section. The conductor access opening is configured to accept one or more plug-in units and facilitate an electrical connection between a conductive portion of the one or more take-off devices or plug-in units and the conductive busbars disposed in the busway housing.

Busway sections may be connected to one another to form a custom configuration as desired, and may be efficiently re-configured if necessary. Systems may include an end cap installed at an end of a length of busway section(s). A joint kit or bus connector is used to form electrical and mechanical connections between busway sections and power feeds by way of compression or bolted means. A power feed that provides connection from incoming cables to the busway system. The power feed includes an NEMA enclosure having access panels configured for cabling and cable access. The power feed includes an internal connection to a section of busway conductors within a busway. The power feed maybe available as an End Feed or a Center or Top Feed box for accommodating existing wire and conduit feeder runs for termination to the End Feed box.

Busway systems may include conductive busbars formed of pure copper, or copper and aluminum, and may be sized to handle 100% of the busway rating under continuous operation up to the maximum ambient temperature. The conductors should be isolated from the housing. An isolated ground may be implemented in the busway track housing the busbars. The busbars or conductors may include a neutral of 1.732 times the conductor rating, for example. Busbars may be formed of high strength 98% conductivity copper, for example, and should be capable of carrying rated current continuously without exceeding a temperature increase of 55 degrees Celsius based on a 40 degree Celsius ambient temperature.

A take-off device may be inserted into the open channel busway conductor access channel to form an electrical connection with busbars contained therein to enable the take-off device to draw power from the busway. The power may be used to load a range of devices ranging from lighting to larger electronic equipment. Larger ampere ratings of larger take-off devices benefit from enhanced contact area and pressure of a connection between busbars and conductive portions of the take-off devices. Some busway systems are configured to include a busbar assembly having an outer portion that is insulative, and an inner, concentrically nested conductive portion. An outer portion of the busbar assembly provides structural support, while the inner conductive portion is flexible and has spring-like resiliency. The outer portion, which may be formed of aluminum or an alloy, for example, may have a generally U-shape or V-shape, and may include a slot opening through which conductive portions or stabs or a take-off device pass before engaging in pressure contact with the inner conductive portion. In particular, the inner conductive portion may include substantially parallel conductors that together define a conductor channel for accepting and securing by spring-contact the stab within the busbar assembly, and thereby, clamping the stab within the housing of the busway track or section, applying pressure and achieving maximum surface contact between the stab and the conductors. In some systems, the conductive portions may include a substantially planar surface that may not be configured to contact multiple faces of a stab.

Plug-in units or take-off devices or units also interchangeably referred to herein throughout as power heads, mast heads, power delivery outlets, or output boxes, may use a circuit breaker or a fuse for branch circuit protection. Plug-in units are configured to include conductive stabs, as discussed above, for insertion into a slot or channel defined by a track of a busway bar system wherein the inserted stab contacts a conductor or conductive busbars disposed within the track. Plug-in units may have locking clips, bolt-on tabs, or other fastening devices or systems for securing the units to the busway. Plug-in units may include drop cords with cord grips and appropriately configured receptacles. The units may be selected, configured, and arranged for balancing a load based on a quantity of plug-in units and unit types. Plug-in units preferably may have at least 35 amperes of distribution capacity for 250, 400, and 800 ampere systems. Thermal magnetic trip-type circuit breakers for branch circuit protection may be used. The units maybe configured for removal from a busway system without requiring that power delivered to the busway be suspended or shut down, and they may include integrated shutters.

SUMMARY

A need has been recognized for improved power distribution power heads, mast heads, plug-in units, or electrical power outlet units. Mast heads in accordance with embodiments improve safety, enhance performance and efficiency, and enable improved form factor, ease of installation into busway systems, enhanced stability, and enhanced monitoring and control when installed in the same.

In an embodiment, a mast head apparatus includes a mast head enclosure having an interior and defining a wire access opening and a plurality of stab slots; and a thermocouple disposed in an interior of the mast head, or in the interior of an output box attached to the mast head, or a combination thereof.

In another embodiment, a mast head apparatus includes a mast head enclosure defining a plurality of stab slots and defining a wire access opening, the plurality of stab slots being vertically aligned along a vertical axis of the mast head enclosure, the wire access opening disposed at a bottom portion of the mast head disclosure.

In another embodiment, a conductive stab for a mast head apparatus may include a first chamfered end configured for insertion into a conductor of a busway bar track, the first chamfered end including a first chamfered surface and a second chamfered surface, the first and the second chamfered surfaces extending from respective principal surfaces that extend parallel to a longitudinal axis of the stab; and a second end for connecting to a wire.

In an embodiment, a tap-off box apparatus includes a mast head, the mast head comprising a mast head enclosure having an interior and defining a wire access opening and a plurality of stab slots, the mast head enclosure shaped and configured for operable insertion into a busway power distribution system; an output box connected to the mast head, the output box define an interior; and a thermocouple disposed in the interior of the output box and configured to detect a temperature therein.

In an embodiment, a tap-off box apparatus, includes a mast head; an output box; and a controller, the controller configured to control an output power from the tap-off box apparatus. In another embodiment, the tap-off box apparatus includes a communications module, the communications module configured to connect the tap-off box apparatus to a communications network. In another embodiment, the communications network is a network selected from the group comprising bluetooth communication, WLAN, WPA, WEP, Wi-Fi, or wireless broadband, or any combination thereof. In another embodiment, the communications network is a wired network, a wireless network, or a combination thereof.

In an embodiment, the tap-off box apparatus includes a transceiver, the communications module to configured to receive and transmits data carrying signals.

In an embodiment, the controller is configured for remote control through the communications network facilitating remote control or monitoring of the tap-off box apparatus. In an embodiment, a toggle switch is disposed on the output box and configured to control an on or off state of the output power from the tap-off box.

In an embodiment, a take-off device system, includes a tap-off box comprising a mast head for electrical connection to a power distribution system, the tap-off box comprising a controller and a communications module together configured for remote monitoring and control of the tap-off box; and an access point geographically remotely located with respect to the tap-off box and configured to access a communications network to which the tap off box is connected for remote control and monitoring of the tap-off box.

In an embodiment, a take-off device system includes a first tap-off box comprising a mast head for electrical connection to a power distribution system, the tap-off box comprising a controller and a communications module together configured for remote monitoring and control of the tap-off box, the first tap-off box connected to a communications network; a second tap-off box comprising a second communications module and configured for remote monitoring and control of the second tap-off box, the second tap-off box connected to the communications network; and access point geographically remotely located with respect to the tap-off box and configured to access the communications network for remote control and monitoring of the tap-off box.

Additional features and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF DRAWINGS

The embodiments of the present disclosure are shown by way of example, and not by way of limitation, in the figures of the accompanying drawing and in which like reference numerals refer to similar elements and in which:

FIG. 5 shows a table of exemplary stab and wire configurations;

DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

A mast head and take-off device power head having enhanced safety features may be configured to minimize a risk of improper or unsafe installation or removal of the power head or plug-in unit in or from the busway bar power delivery system. For example, some busway systems may be configured to include or accommodate a busway plug-in inhibitor system or component for rotational take-device or output box units. An inhibitor system may include a structural feature that inhibits over-rotation or improper rotation, or may include a system for alerting or warning a user about the potential, likelihood, or occurrence of improper rotation of a power head or paddle during removal of the power head from the busway bar that is under load, which can result in property damage and personal injury. An inhibitor system may be configured for implementing in existing busway bar systems without requiring modification of an existing installation and thereby enabling efficient retro-fitting and updating of busway power delivery systems that have already been deployed.

There is a need for monitoring and control of output boxes and other components such as end feed units and the like to enhance safety and efficient operability of busway power distribution systems. There is a need, for example, for remote monitoring of operating conditions such as temperature and on or off state of a tap-off box or unit including an output box and a mast head that connects the output box to a busway way bar. There is also a need for remote control of a tap-off box. There is still further a need for a system wherein tap-off boxes are configured for networked communication using wired or wireless networks, or a combination of both. These needs and others are met by embodiments disclosed herein.

Figure 1:
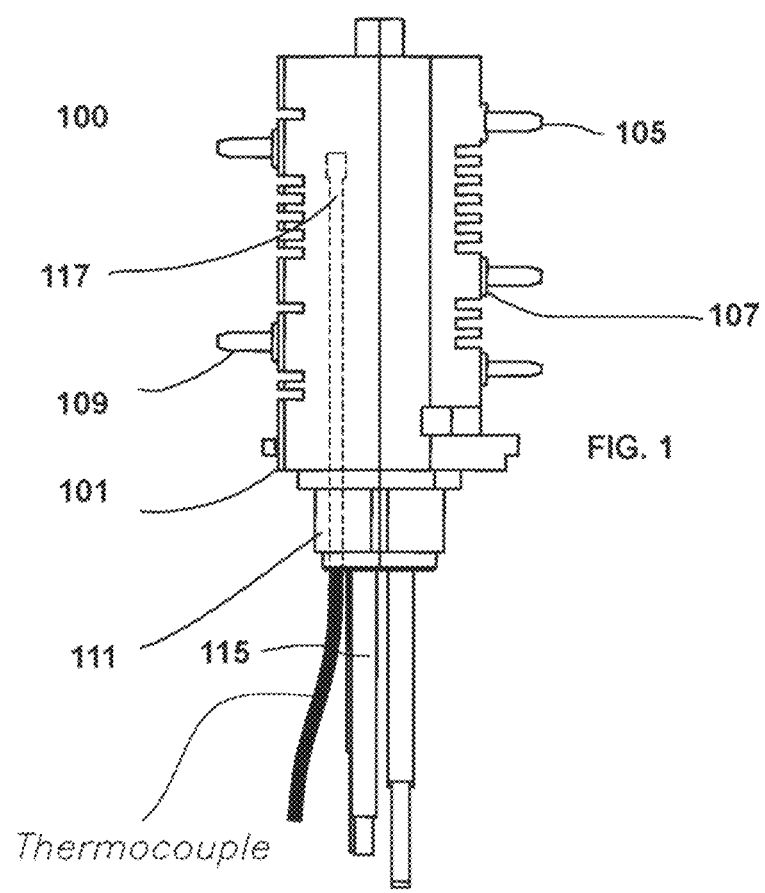
FIG. 1 shows a mast head of a take-off device in accordance with an exemplary embodiment.

The need for remote monitoring and control or tap-off units, and easier, secure, and safe installation may be addressed and systems enhanced through take-off device configurations in accordance with embodiments disclosed herein. For example, a power head or mast head 100 in accordance with an exemplary embodiment is shown in FIG. 1. In particular, FIG. 1 shows a head enclosure 101 having conducting stabs extending from an interior of the head enclosure 101 to an exterior thereof. Stabs 105 extending from a first side of the head enclosure 101 protrude from a plurality of stab slots 107 defined by the head enclosure 101. Stabs 109 may extend from a second side of the head enclosure 101. Wires connected to the stabs 105 and 109 extend from an interior of the head enclosure through an opening 111 defined thereby. FIG. 1 shows wires 115 extending through the defined opening 111. FIG. 1 shows that a thermocouple may be fitted in the head enclosure and extend through the defined opening in accordance with some embodiments.

A need for stable, enhanced, improved, and maximized electrical connectivity between stabs of a power head or output box and a conducting member or bar assembly of a busway track system has been recognized. The stabs 105 and 109 extend for insertion into a busway conductor track slot or opening to make an electrical connection between wires contained within the power head and the conductor of the busway track. The stabs slots defined by the head enclosure 101 may be vertically aligned on at least one side of the head enclosure 101 for enhanced internal wire configuration and improved installation efficiency, safety, connectivity, and stability.

Figure 2:
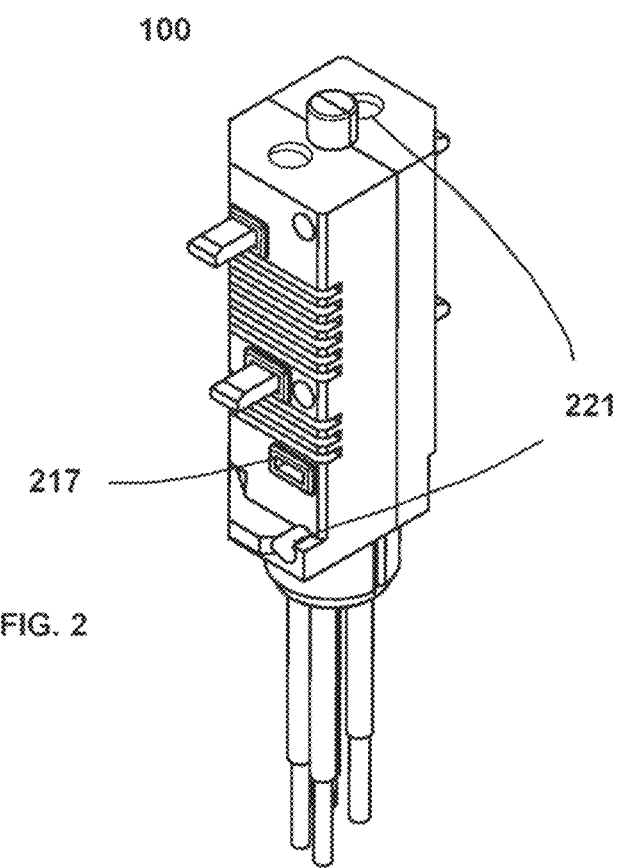
FIG. 2 shows a top perspective view of the mast head of FIG. 1 in accordance with an exemplary embodiment.

FIG. 2A shows a top perspective view of a first side of the head enclosure 101 of FIG. 1. The mast head includes a ground slot 217 through which no stab extends. Additionally, FIG. 2 shows air flow openings 221 defined by the mast head for passive cooling or to accommodate forced air through-flow. One of more air flow openings 221 may be defined in a mast head exterior and optimally arranged for minimizing mast head interior operating temperatures.

FIG. 2B shows a top perspective of a first side of the head enclosure 101 of FIG. 1. FIG. 2B shows air flow openings 223 arranged a top of the mast head for passive cooling and to accomodate air flow, force or otherwise. The air flow openings 223 are configured and arranged to align with a channel of a busway into which the mast head is inserted.

Figures 3A, 3B:
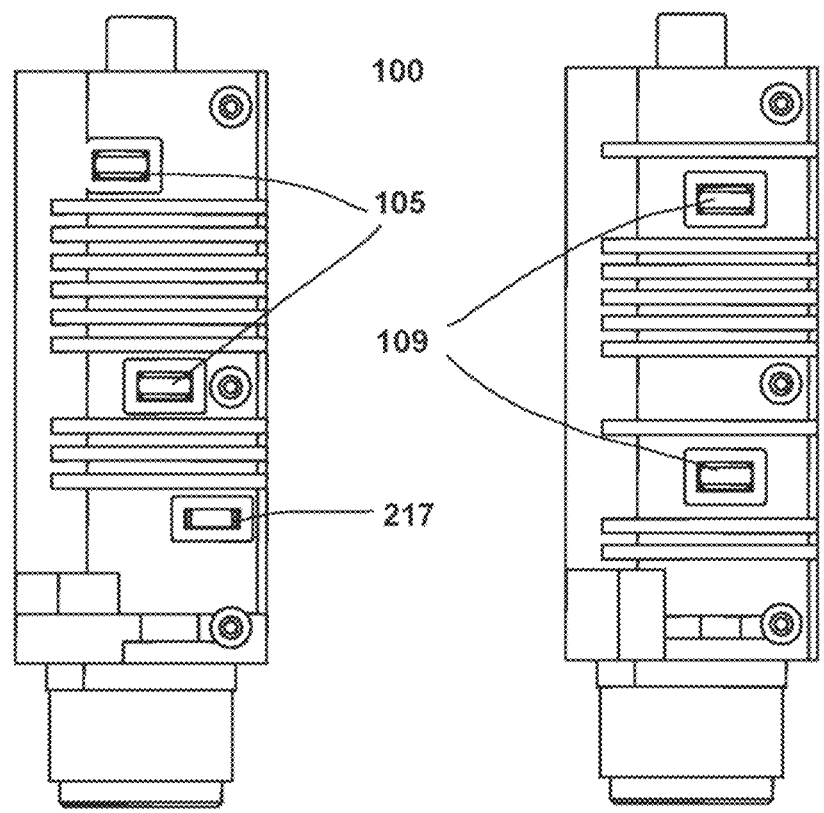
FIG. 3A shows a first side view of the mast head of FIG. 1 in accordance with an exemplary embodiment.
FIG. 3B shows a second side view of the mast head of FIG. 1 in accordance with an exemplary embodiment.

FIG. 3A shows a side view of a first side of the head enclosure 101 of the mast head 100 of FIG. 1. The stabs 105 are not vertically aligned. Further, the ground slot 217 is not vertically aligned with the stabs 105. In some embodiments, the mast head 100 may not include a ground slot 217. FIG. 3B shows a side view of a second side of the head enclosure 101 of the mast head 100 of FIG. 1. The stabs 109 are vertically aligned. This configuration accommodates enhanced installation convenience and safety and stability for contact between the conductive stab surface and busway conductors into which the stabs are inserted.

Figure 4:
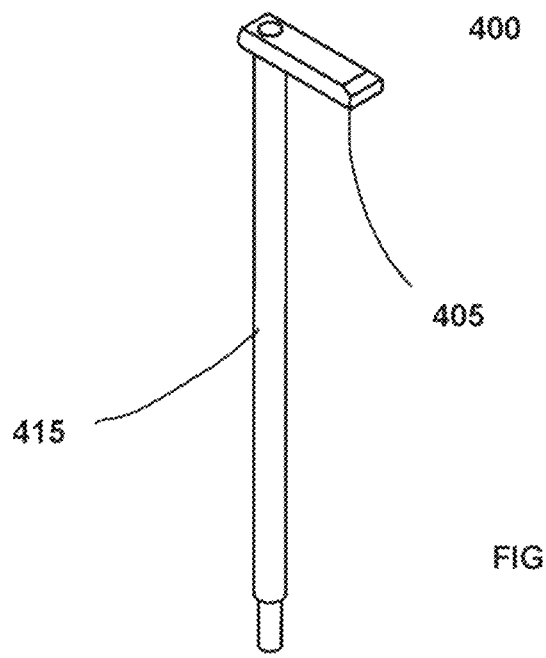
FIG. 4 shows a conducting stab and connected wire in accordance an exemplary embodiment.

FIG. 4 shows a top perspective view of a stab assembly 400. The stab assembly 400 includes a conductive stab 405 connected to a wire 415. Various gauges of wire may be used including #4AWG and #6AWG, for example. Preferred wire gauges may be a gauge in a range of from #4AWG to #12AWG, for examples. There is a need for a power head that may accommodate larger wire gauges including #6 and #4 sizes. Related are power head assemblies include internal configurations, for example, that limit a size of wire that may be contained within the base and cap subs-assembly. Vertically aligned stab openings, and in some cases, removal of the isolated ground opening, provides internal room for configurations that can accommodate larger wires sizes. A stab width may be appropriately increased for correspondingly larger wire gauges. For example, it has been found that a stab width of 0.375 to 0.378 may be advantageous for use with a #4AWG wire. A width of a stab for use with #6AWG or #8AWG may be correspondingly smaller, for example.

There is a need for output boxes having an optimal structural configuration that enables enhanced power delivery and maximized electrical contact between a stab of the output box and a conducting surface of a busway track. There is also a need for an output box with monitoring functionality, and in particular, thermal monitoring functionality. Thermal monitoring using a thermocouple as shown in FIG. 1 may enable targeted temperature monitoring at an installed output box, which can enhance applications in large data centers that often operate at high temperatures well over room temperatures, commonly known as "hot aisles."

The stab is a conductive component that may be formed of any suitable conductive material, and that is connected to a wire to facilitate an electrical connection between busbars contained within a busway track and wire contained within a take-off device or output box. A stab 405 as shown in FIG. 4 may have a rounded or chamfered end configured for enhanced and efficient insertion into a busway bar slot, track, or opening. This configuration enhances and maximizes surface area contact between a stab and a conductor of a busway bar system to enhance electrical connectivity, which is enhanced in pressure-fit busbar assembly systems wherein the stab contacts the conductors under pressure.

The stab 405 shown in FIG. 4 is advantageously configured and shaped for optimal surface area contact with a conductor bar of a busway bar system. For example, an end of the stab may be configured to include two chamfered edges that extend from principal surface of the stab along a longitudinal axis of the stab. The chamfer angles of the two chamfer surfaces shown in the figures above is 20 degrees. It has been fond that a stab having chamfered edges, particularly with chamfer angles of 20 degrees, exhibits enhanced electrical connectivity and eases installation into busway bar tracks or openings.

Figure 6:
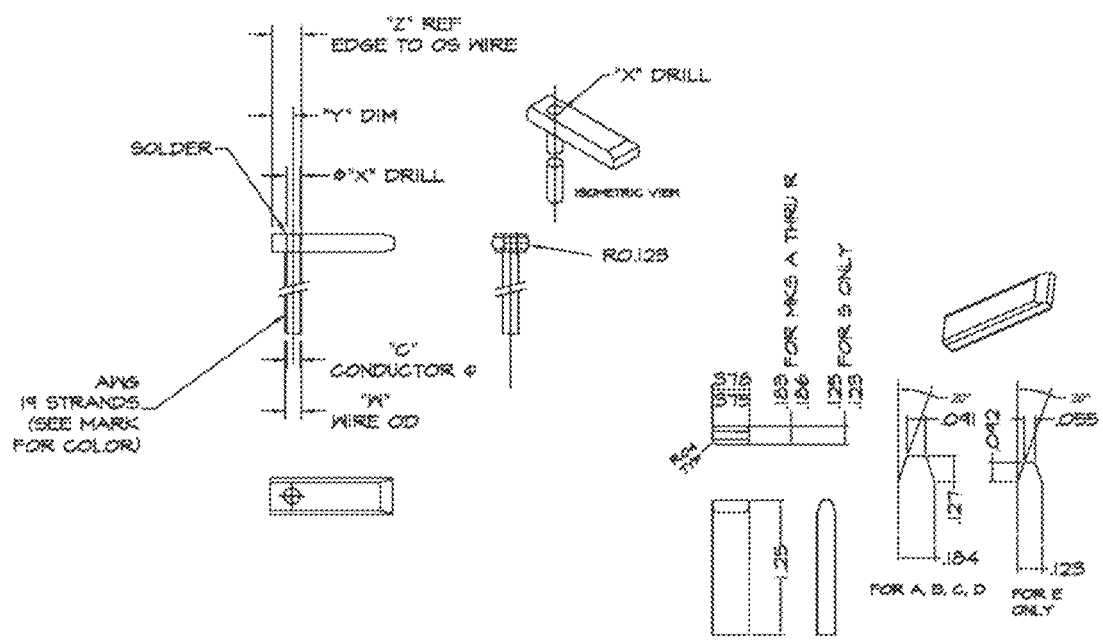
FIG. 6 shows stab characteristics corresponding with values shows in the table of FIG. 5.

It has been found that a modified stab width may be advantageous for using wire gauges of particular sizes. For example, large stab widths may be appropriate for larger gauge wires. The dimensions and configurations shown FIG. 5 are illustrative and non-limiting. Additionally, the drawings of the stab in FIG. 6, to which the table of FIG. 5 refers are not necessarily to scale.

FIG. 5 shows stab assembly dimensions and specifications by way of example with reference to wire gauges of various sizes including #4AWG, #6AWG, #8AWG, and #10AWG. The specifications include values of distances in units of inches. A stab having a width of between 0.375 inches and 0.378 inches may be advantageous for use with a #4AWG wire.

Figure 7A:
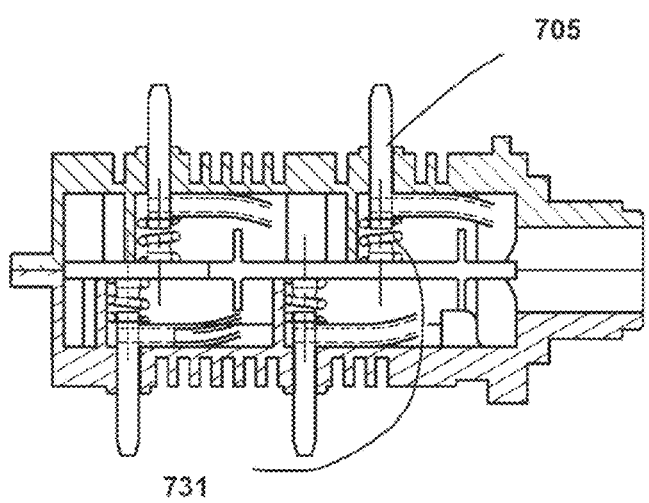
FIG. 7A shows a cross-sectional side view of a mast head having seated, spring-fitted stabs in accordance with an exemplary embodiment.
Figure 7B:
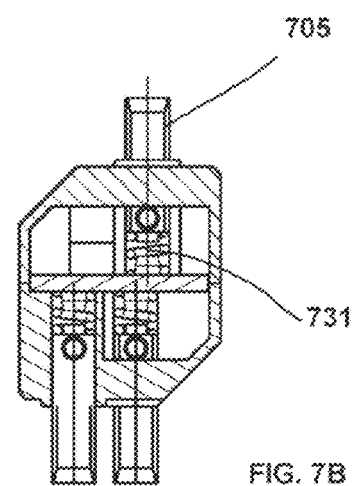
FIG. 7B shows a cross-sectional end view of a mast head having seated, spring-fitted stabs in accordance with an exemplary embodiment.

A need has been recognized for providing larger diameter wire access openings in mast head or output boxes useful for busway busbar systems. For example, for a main lug 3 phase 208/120 VAC output box that is configured to work with three hot busbars, one neutral busbar, and one isolated ground bar, 85 amperes may be provided by way of a one inch conduit defined in the busway mast head. Larger wire access diameters may be implemented to accommodate larger number or gauge wires. For example, a 1.25 inch or 1.5 inch wire access opening or conduit may be used to accommodate larger gauge wires, or a larger number of wires. While these diameters are provided by way of example, the wire access opening or conduit may be made to include diameters of other sizes to accommodate particular wires sizes and numbers as appropriate FIG. 7A shows a stab assembly seated in a busway system including stabs 705 having springs 731. The springs may be constructed and arranged of any suitable now known or later developed materials and configuration. The springs 731 may be configured to enable the stab 705 to retract a distance within the head enclosure during insertion of the mast head into a busway system, and to extend under spring action through the stab slot until fully extended and inserted into a busway conductor assembly. The spring force may be sufficient to permit retraction during insertion, and in some embodiments, may be sufficient to enhance insertion and position of the stab in the conductor assembly. FIG. 7B shows a cross-sectional end view of the stabs 705 and springs 731 in an extended position.

Figure 7C:
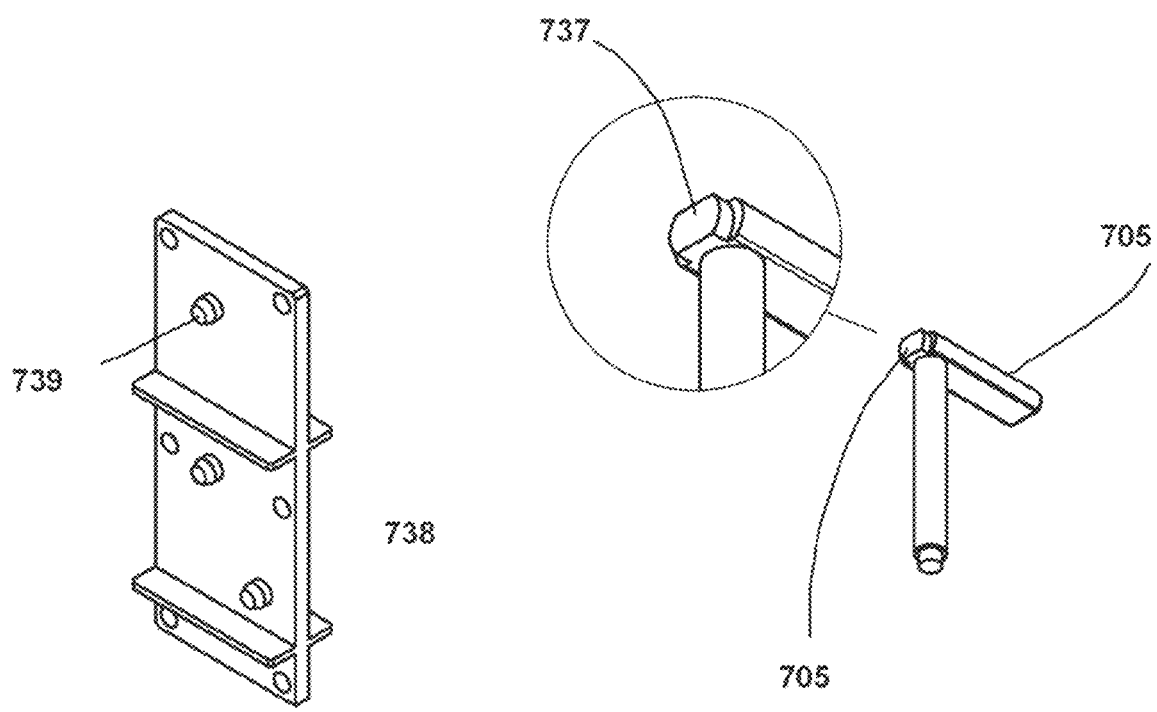
FIG. 7C shows a cross-sectional end view of a mast head having seated, spring-fitted stabs in accordance with an exemplary embodiment.

FIG. 7C shows a stab assembly 705 having a rear contact portion 737 configured for contacting an internal member such as a divider in mast head enclosure. An exemplary divider 738 is shown. The divider 738 includes spring structures 739 that decompress when the rear contact portion 737 is urged toward the divider 738 and against the spring structures 739.

A need has been recognized for enhanced take-off device configurations for accommodating larger wire sizes. For example, a mast head as shown in FIG. 1 may be configured to define or include stab slots that are aligned for optimal busway mounting, having an interior wherein one of wires are arranged for optimal space conservation. It has been recognized that the isolated ground feature is rarely used for many applications today, and additional space for advantageous internal configuration of the mast head may be defined by eliminating the isolated ground from mast head and cap and base sub-assembly configurations in accordance with apparatus of embodiments.

Figure 8:
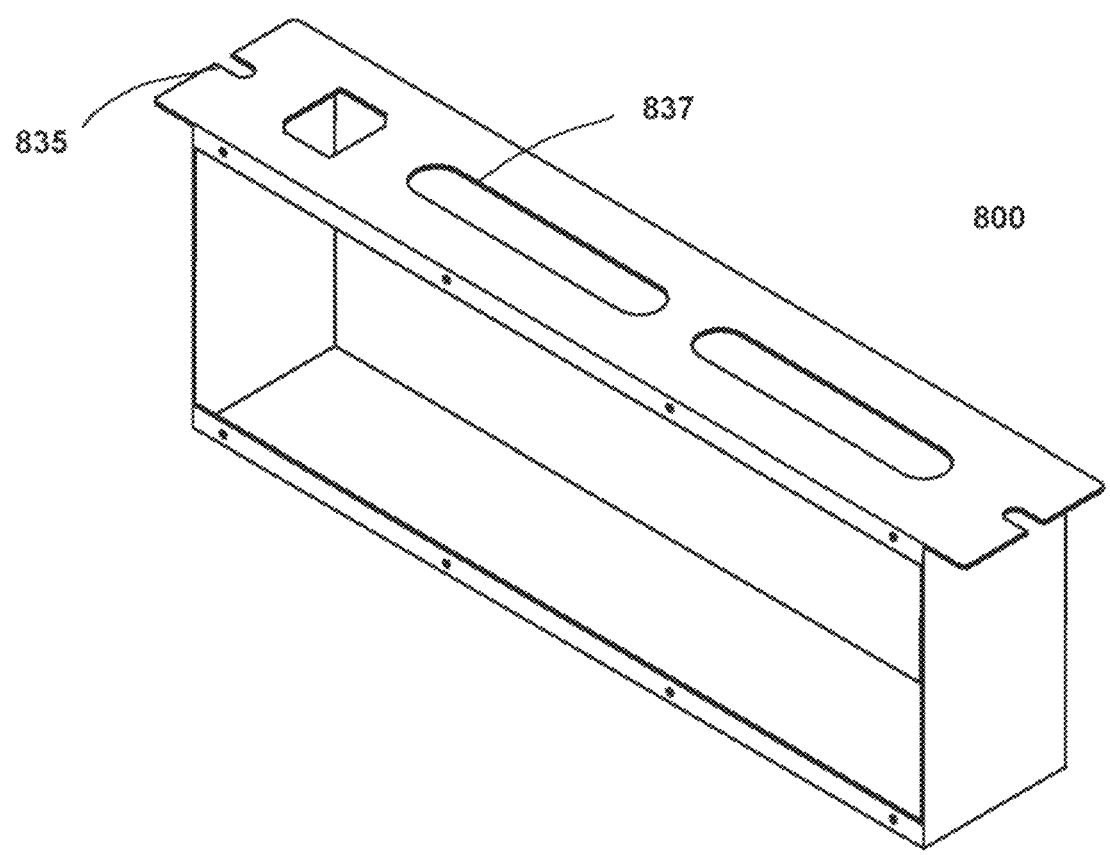
FIG. 8 shows an enclosure of a take-off device for us with a mast head in accordance with an exemplary embodiment.
Figure 9:
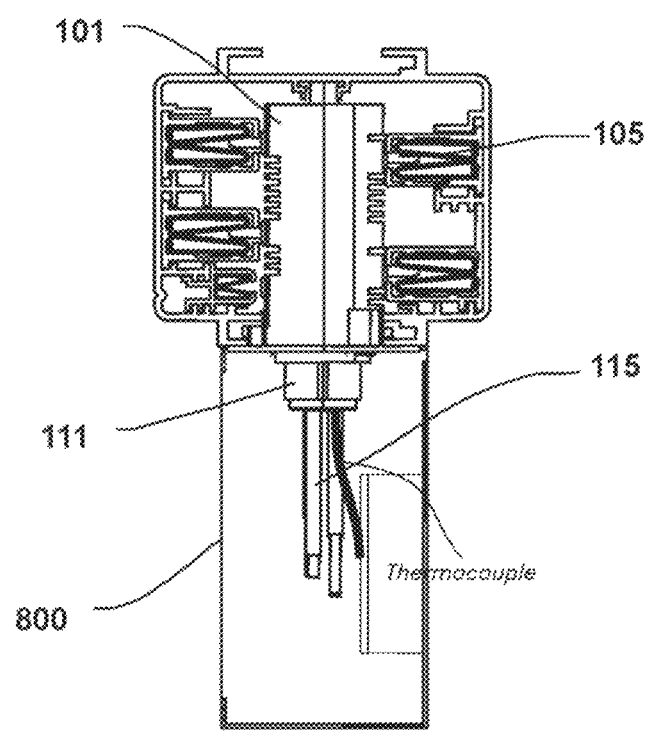
FIG. 9 shows a cross-sectional side view of a take-off device engaged with a busway system having a thermocouple extending from the mast head in accordance with an exemplary embodiment.

A need has been recognized for improved take-off device configurations for use with a mast head as shown in FIG. 1, for example. FIG. 8 shows an enclosure for use with a mast head of FIG. 1 for receiving the wires 115 of the FIG. 1, and for providing other functions. FIG. 8 shows the enclosure 800 having support structures 835. An enclosure in accordance with an embodiment may have at least one such support structure 835 for securing a take-off device to a busway system. The enclosure 800 may include slots 837 defined by the enclosure 800. The slots 837 may facilitate communication between an interior of the enclosure 800 and an interior of a busway channel when the take-off device to which the enclosure 800 is attached is installed in a busway system, as shown in FIG. 9.

A need has been recognized for enhanced power monitoring for take-off devices. Busway bar power delivery systems may optionally include power feed monitoring systems and functionality. A power feed may be provided with power measurement capability and a remote monitoring interface for monitoring at least one of the following: input voltage (L/L and L/N); current per phase (Min/Max); voltage per phase (Min/Max); neutral current; power factor; frequency; power (active, reactive, apparent); demand (kWH); voltage and current THD %; and current peak demand, preferably with an accuracy of better than 0.5%.

A need as been recognized for enhanced monitoring using a plug-in unit monitoring system for top feed and center feed boxes. An output box monitoring system may be configured with power measurements capability and remote monitoring interface for monitoring at least one of the following: input voltage (L/L and L/N); current per phase (Min/Max); voltage per phase (Min/Max); power factor; frequency; power (active, reactive, apparent); demand (kWH); current peak demand, preferably with an accuracy of better than 1%. Plug-in monitoring systems must be serviceable without requiring that the plug-in be removed or powered down, and must support 1, 2, and 3 pole circuits with varying configurations up to 8 circuits per plug-in unit. Plug-in monitoring systems may optionally be further configured for power quality monitoring including: voltage and current harmonics up to the 63rd harmonic, current and voltage harmonic magnitudes and angles (per phase), phase rotation, sequence components, voltage THD, current THD, input voltage (L/L and L/N); current per phase (Min/Max); voltage per phase (Min/Max); power factor; frequency; power (active, reactive, apparent); demand (kWH); current peak demand, temperature, humidity using a Dallas 1-wire, for example, and preferably with an accuracy of better than 0.5%.

Systems in accordance with embodiments may be advantageously configured for real-time power monitoring. In an embodiment, control monitoring components may be configured to facilitate fast sampling at a ration of, preferably, twice per second. Monitoring may be configured to include coverage of a single take-off box, or multiple take-off boxes.

Figure 10A:
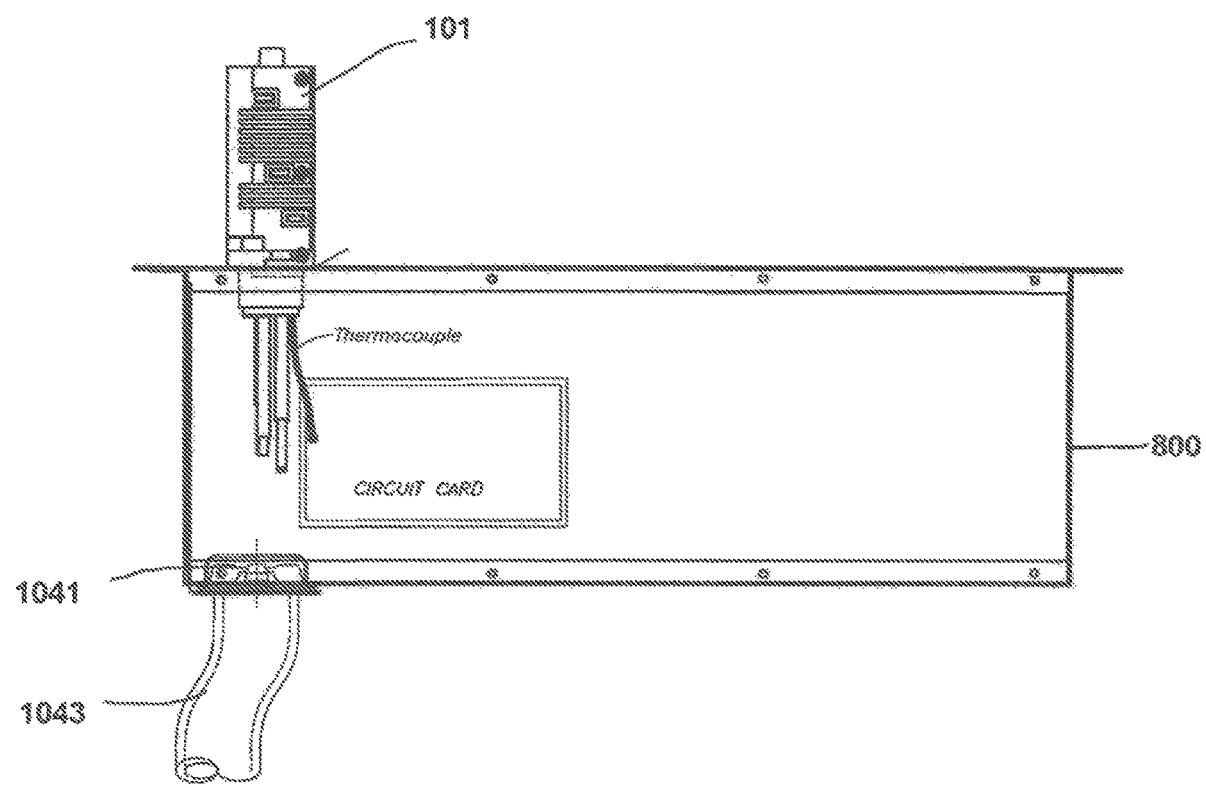
FIG. 10A shows a cross-sectional side view of a take-off device engaged with a busway system having a thermocouple and forced air flow system in accordance with an exemplary embodiment.

A mast head 101 connected to an enclosure 800 and including a thermocouple for thermal monitoring in accordance with an embodiment is shown in FIG. 10A. The mast head is configured to accept and secure a thermocouple that is connected to a wire. The wire extends along with one or more other wires that may be connected to one or more stabs, respectively, for delivering power. Accordingly, a take-off device may be advantageously configured for thermal monitoring. Similarly, existing assemblies of pre-deployed output boxes may be retrofitted to include a mast head that is configured to receive and secure a thermocouple for thermal monitoring. The thermocouple may be connected to any now known or later developed monitor or monitoring system such as a digital monitor suitable for collecting and transmitting real-time temperature, humidity and dew point data to protect, for example, large data center equipment and personnel from heat and moisture. A digital sensor may be configured for remote temperature sensing and power monitoring. Such sensors and monitoring systems are now commercially available from GEIST, for example.

Figure 10B:
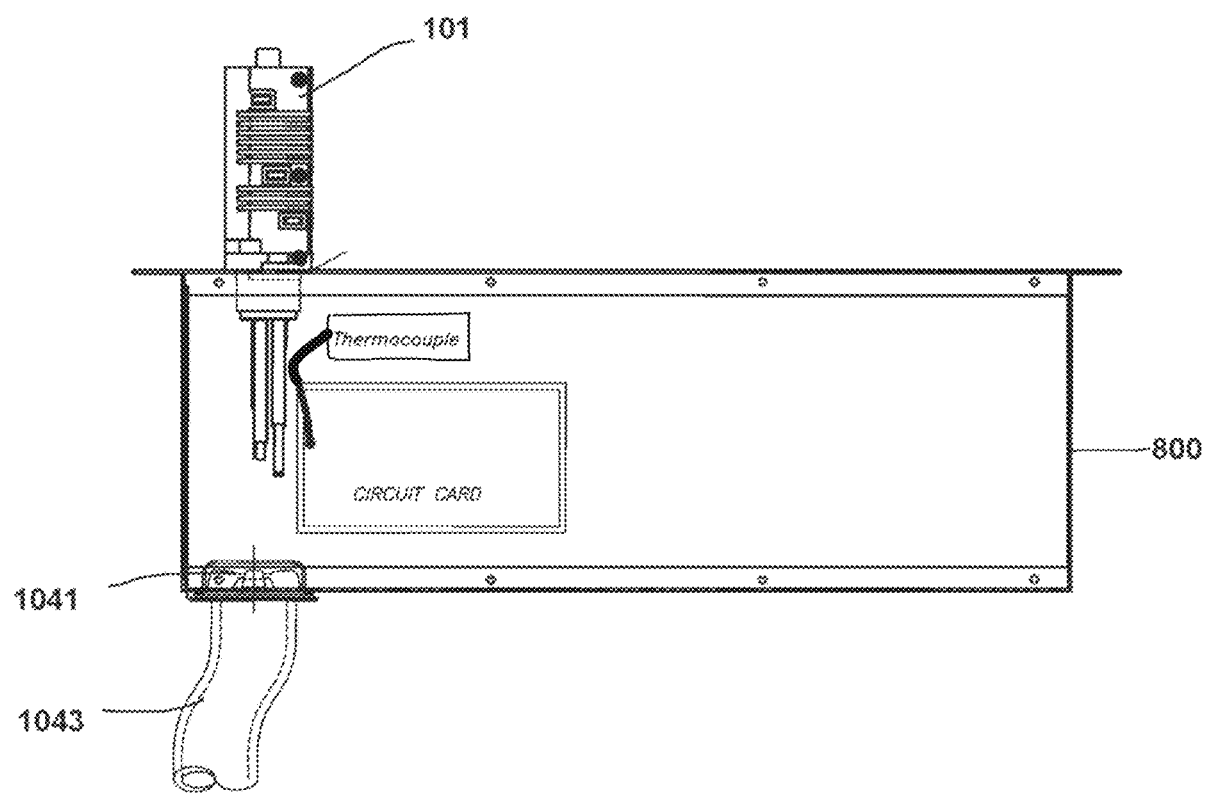
FIG. 10B shows a cross-sectional side view of a take-off device engaged with a busway system having a thermocouple diposed in an enclosure of the take-off device in accordance with an exemplary embodiment.

In an alternative embodiment, the take-off device may be implemented with a thermocouple or any now known or later developed sensor for detection of a temperature within the output box, or the enclosure connected to the mast head. FIG. 10B shows the thermocouple disposed in the output box. In an alternative embodiment, the thermocouple may be configured in a top opening of the mast head for detecting a temperature of an interior of the busway into which the mast head is inserted (not shown).

FIG. 10A shows cross-sectional side view of a take-off device having a mast head 101 connected to an enclosure 800 in accordance with an embodiment. The enclosure 800 shown in 10A optionally includes a fan 1041 positioned at a bottom of the enclosure 800, beneath the mast head 101, and above an airflow duct 1043 that communicates with an interior of the enclosure 800 by way of the fan 1041.

A need has been recognized for a cooling system that is based on a set point triggered by obtaining a measurement from a monitoring system that is configured to monitor thermal activity at the mast head in a busway bar power delivery system or at an output box connected to a busway. A busway cooling and monitoring system may include a cold air delivery system that is configured for delivering air from a cold aisle section of a data center rack, for example, or other cold air source, to an output box. A temperature-activated fan may be set at 100 degrees Fahrenheit and draw the cold air into the output box to maintain an ambient temperature at the output box of under 104 degrees Fahrenheit. The fan may be mounted in the output box, or outside of the output box. The fan may be any suitable now known or later developed fan or other device useful for producing air current and drawing cool air, or in alternative configurations, forcing cool air. A controller may be coupled to the fan and to a monitoring system for controlling the fan in response to temperature readings or determinations made by the monitoring system. Multiple fans and monitoring systems, sensors, controllers, or associated devices may be used. A need has also been recognized for monitoring and control of humidity. Suitable now known or later developed sensors may be implemented for communicating humidity information, which may be used to inform temperature or air flow control. Accordingly, issues associated with, for example, condensation induced by temperature control measures including air cooling may be addressed.

Figure 11:
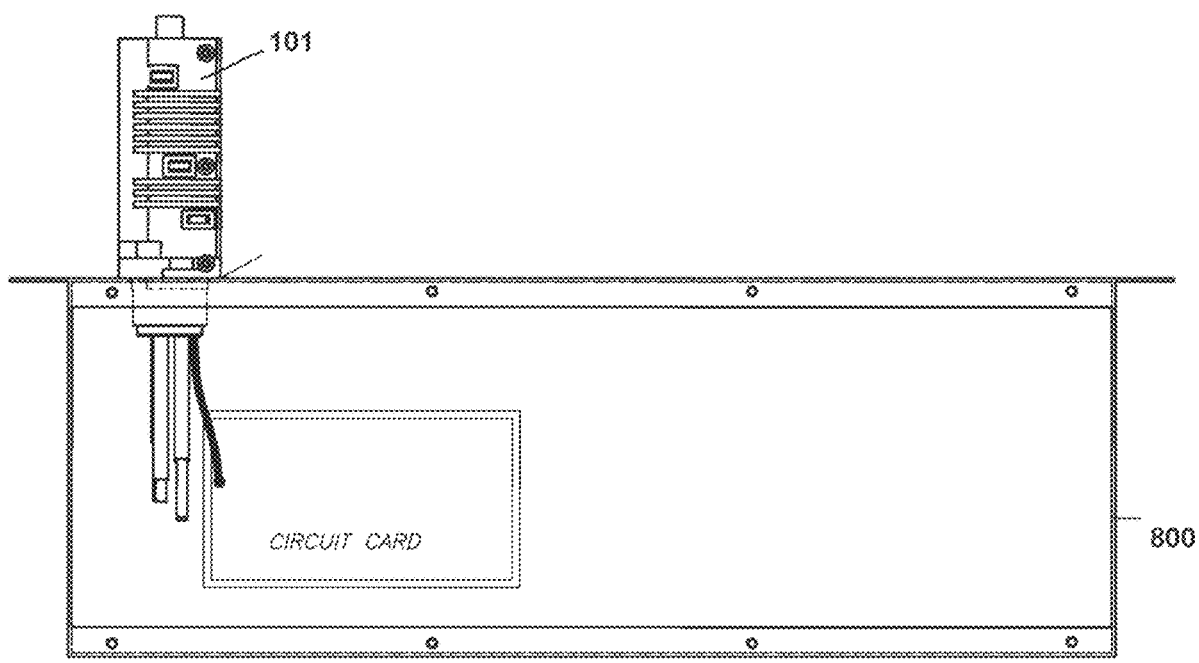
FIG. 11 shows a cross-sectional side view of a take-off device engaged with a busway system having a thermocouple and passive airflow system in accordance with an exemplary embodiment.

FIG. 11 shows a cross-section view of a take-off device having a mast head 101 connected to an enclosure 800. In the embodiment of FIG. 8, the enclosure 800 does not include a fan, or air flow duct communicating through a fan.

Figure 12A:
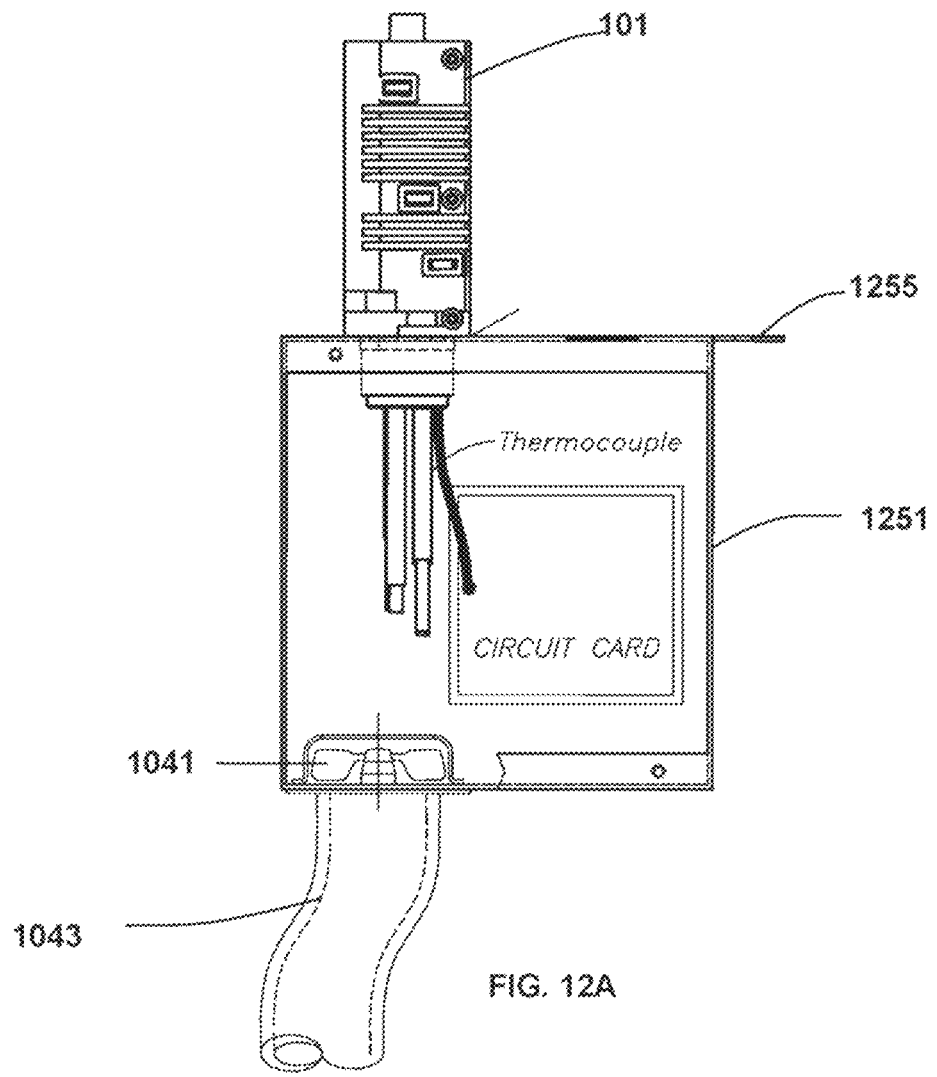
FIG. 12A shows a cross-sectional side view of a take-off device engaged with a busway system having a thermocouple and forced airflow system in accordance with another exemplary embodiment.

FIG. 12A shows a cross-sectional side view of a take-off device having a mast head 101 connected to an enclosure 1251 in accordance with an embodiment. The enclosure 1251 includes a fan positioned at a bottom of the enclosure 800, beneath the mast head 101, and above an airflow duct 1043 that communicates with an interior of the enclosure 800 by way of the fan 1041. The enclosure 1251 includes a single tab disposed distal to mast head 101 at a top of the enclosure 1251. The tab 1255 may be used to secure the take-off device to a busway system.

Figure 12B:
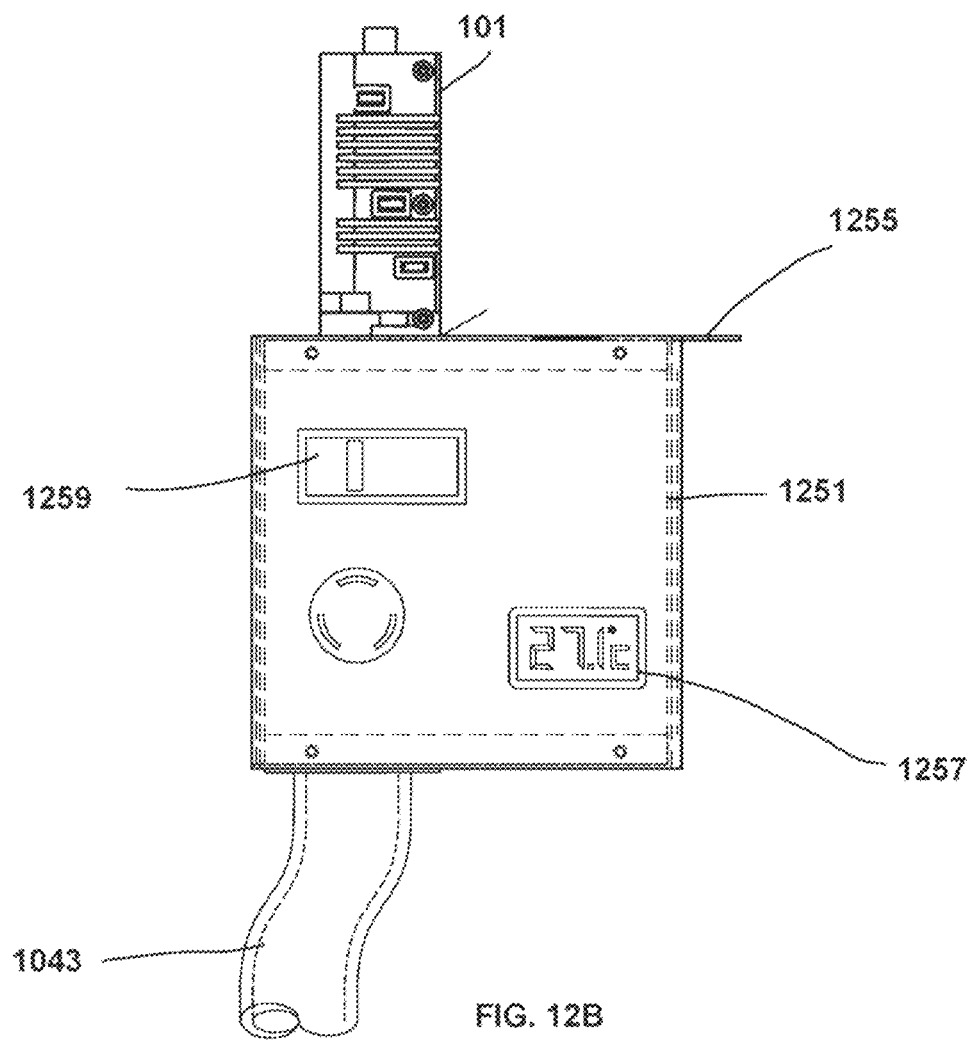
FIG. 12B shows a side view of the take-off device of FIG. 12A.

As shown in FIG. 12B, as outside of the enclosure 1251 of FIG. 12A may include a digital readout 1257 and a toggle switch 1259 in accordance with an embodiment. Other now known or later developed output, display, or user input devices may be implemented for use with take-off devices in accordance with embodiments. The digital readout 1259 of FIG. 12B provides temperature monitoring and control, humidity monitoring and control, or a combination of the same. In association, fans may be configured for activation based on a determined humidity level.

In one cooling system, a cool air delivery system may be configured at the busway for maintaining an ambient temperature of below 104 degrees Fahrenheit. One or more fans may be configured for drawing cold air from the cold aisle and supplying the air to the busbar assembly in the busway. The busway may include strips, shutters, or the like for covering and substantially sealing openings of the busway whereby air may be ducted into the busway from the cold aisle, or ducted from data center CRAC units disposed at various points along a busway. The air may be ducted using a modified plug-in output box with fan and an open slot. When the modified plug-in output box is installed in a busway, the open slot enables an interior of the output box to communicate with the busway thereby enabling air to flow from the output box into the busway.

Figure 13:
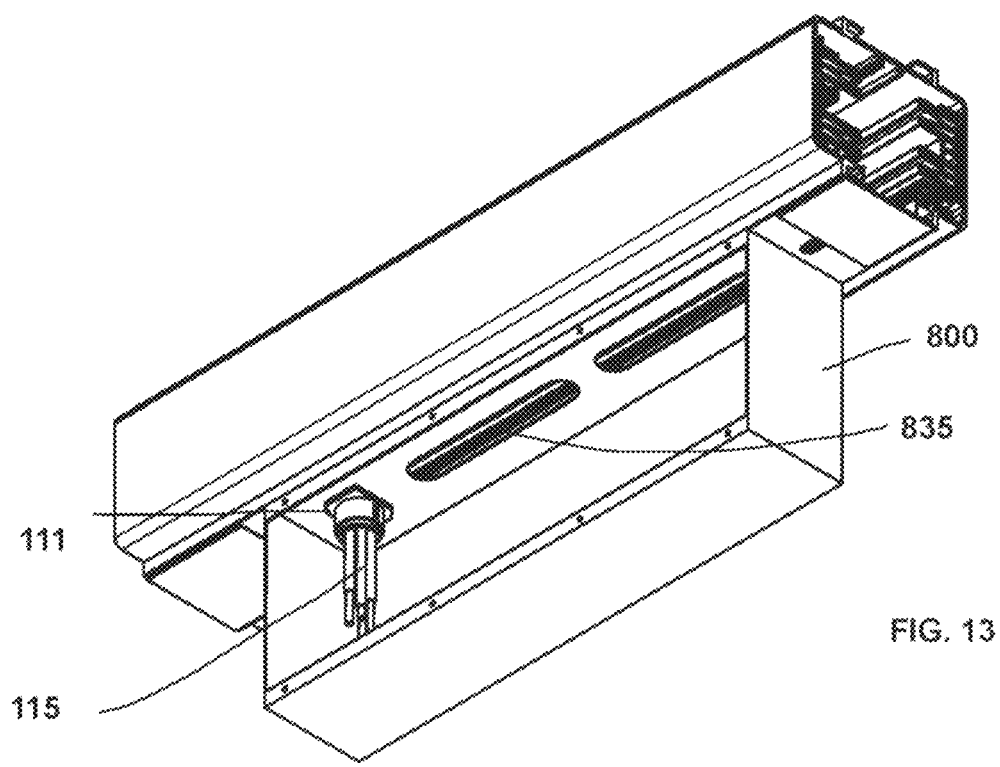
FIG. 13 shows a bottom cross-sectional perspective view of a take-off device engaged with a busway system having a thermocouple and passive airflow system in accordance with an exemplary embodiment

FIG. 13 shows a bottom cross-sectional perspective view of an enclosure 800 with a mast head opening 111 and wires 115 extending therein. The enclosure 800 is connected to a busway system and the air flow opening 837 facilitates air flow between an interior of the enclosure 800 and an interior of the busway channel.

Figure 14A:
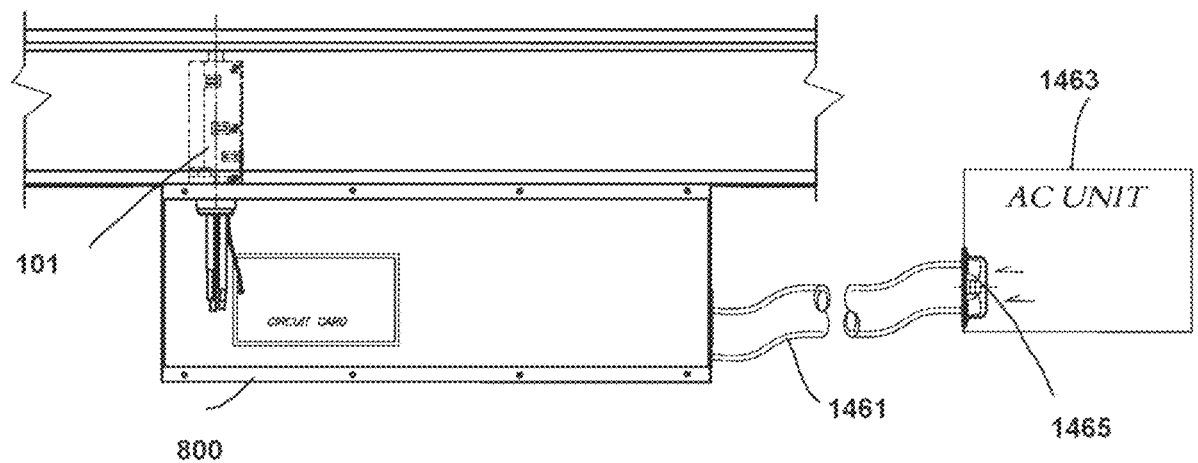
FIG. 14A shows a cross-sectional side view of a take-off device engaged with a busway system having a thermocouple and forced airflow system in accordance with another exemplary embodiment.

FIG. 14A shows a cross-sectional side view of a take-off device engaged with a busway system having a thermocouple and forced airflow system in accordance with another exemplary embodiment. FIG. 14A shows a mast head 101 installed in the busway system and attached to an enclosure 800. The enclosure 800 is connected to air source by an air flow duct 1461 at a side of the enclosure. The air source is a air conditioning unit 1463. A fan 1465 disposed at the air conditioning unit 1463 forces air, including cool air, through the air flow duct 1461 and into the enclosure 800 for circulation in the enclosure 800 and mast head 101.

Figure 14B:
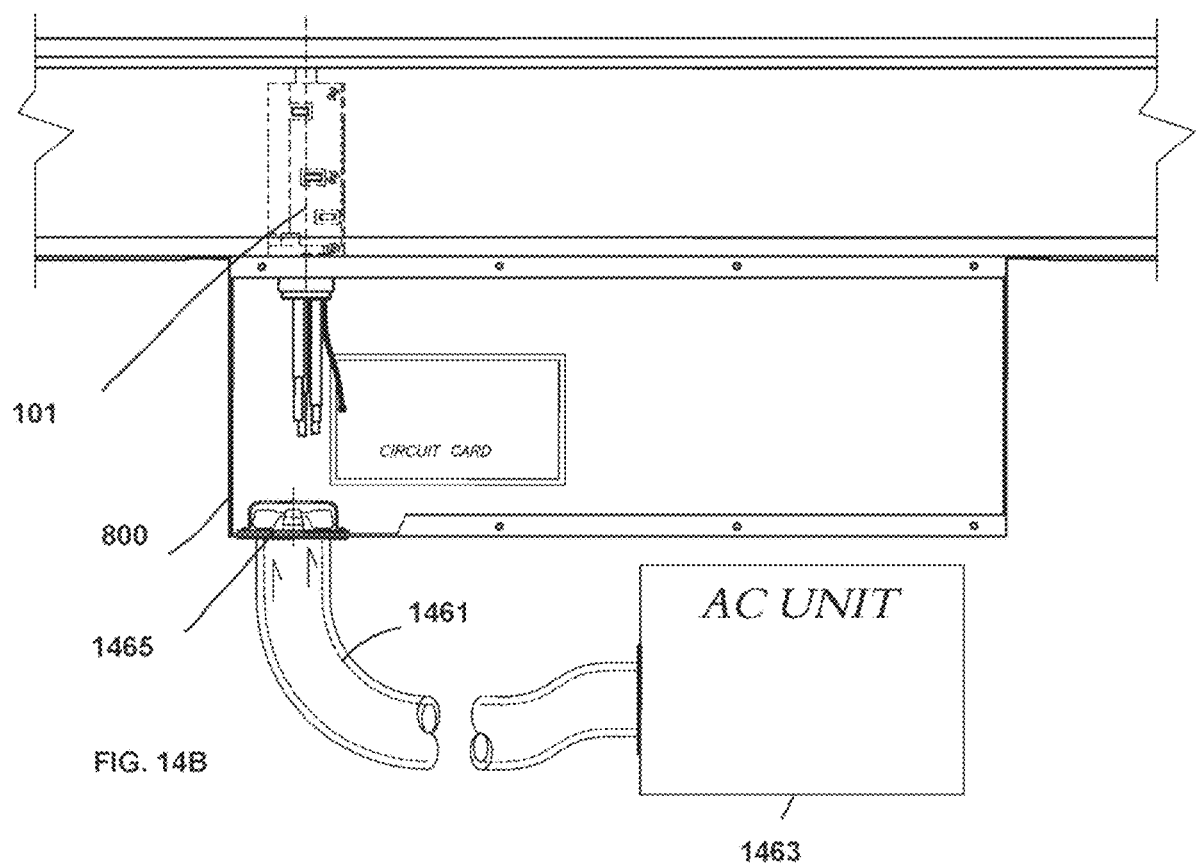
FIG. 14B shows a cross-sectional side view of a take-off device engaged with a busway system having a thermocouple and forced airflow system in accordance with another exemplary embodiment.

FIG. 14B shows a cross-sectional side view of a take-off device engaged with a busway system having a thermocouple and forced airflow system in accordance with another exemplary embodiment. FIG. 14A shows a mast head 101 installed in the busway system and attached to an enclosure 800. The enclosure 800 is connected to air source by a air flow duct 1461 at a bottom of the enclosure 800. The air source is an air conditioning unit 1463. A fan 1465 disposed at an interior bottom of the enclosure 800 and forces air, including cool air, through the air flow duct 1461 and into the enclosure 800 for circulation in the enclosure 800 and mast head 101.

Figure 15:
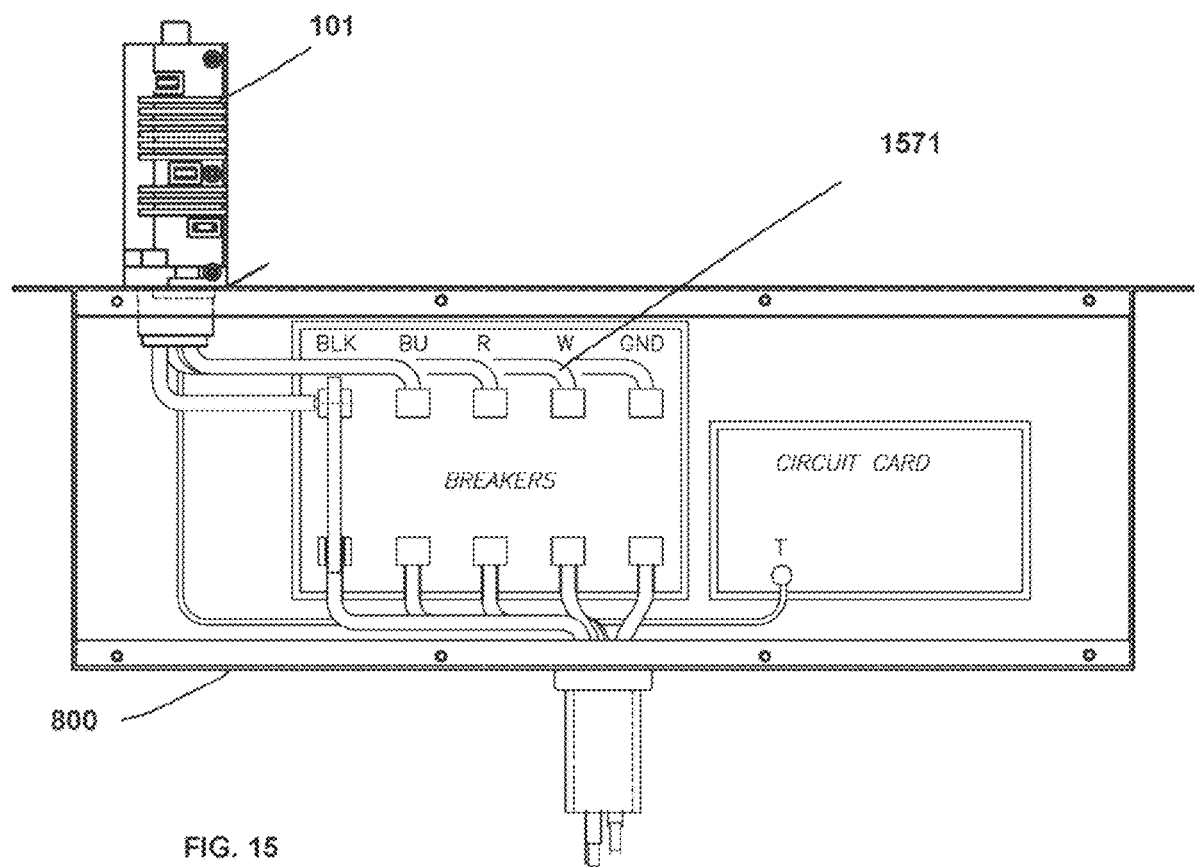
FIG. 15 shows a cross-sectional side view of a take-off device engaged with a busway system in accordance with another exemplary embodiment.

FIG. 15 shows a cross-sectional side view of a take-off device engaged with a busway system in accordance with another exemplary embodiment. FIG. 14A shows a mast head 101 installed in the busway system and attached to an enclosure 800. The enclosure 800 includes a circuit breaker panel or load center 1571 for providing switching function and protection.

In an embodiment, a tap-off box or output box or take-off device includes a controller for controlling the power of the tap-off box. In another embodiment, the tap-off box includes a controller configured to operate and control the tap-off box and its functions, including monitoring functions. For example, the tap-off box may include contactors or similar suitable device and circuitry configured to controlling an output load of the tap-off box.

Figure 16A:
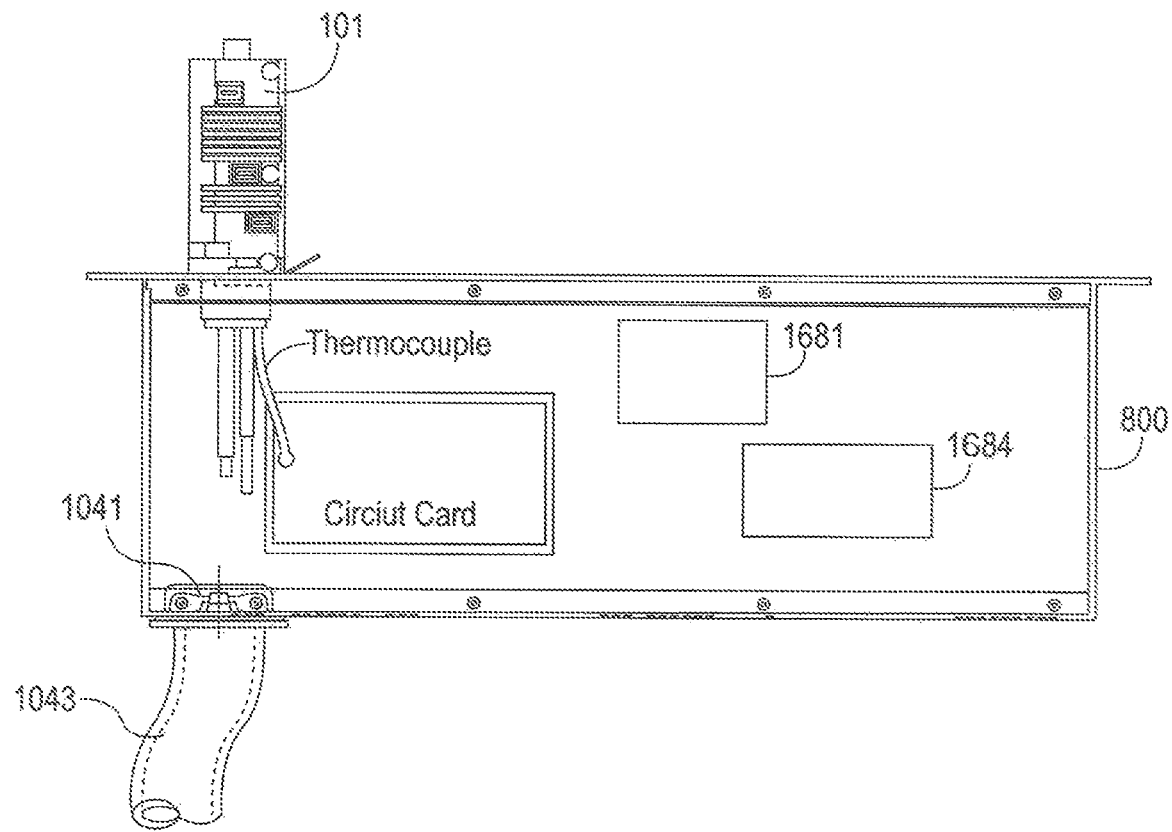
FIG. 16 shows a tap-off box including a mast head 101 installed in the busway system and attached to an enclosure 800.

FIG. 16A shows a an embodiment of a tap-off box for remote control, monitoring, or a 10 combination thereof. In particular, tap-off box includes a mast head 101 installed in the busway system and attached to an enclosure 800. The enclosure 800 includes a controller 1681 and circuitry configured to control output power from the tap-off box. The controller 1681 may be configured to locally controlled to turn on or off the output power of the tap-off box. The controller 1681 is configured to remotely control the output power of the tap-off box by a communications module 684 and associated components constructed and arranged for operable remote wired or wireless communications. Alternatively, or additionally, the enclosure 800 includes a monitoring system as disclosed herein that is configured, for example, for monitoring a temperature of an interior of the mast head 101, in the interior of the enclosure 800, or a combination thereof (not shown).

For example, in the embodiment shown in FIG. 16A, the communications module 1784 may include a receiver, transmitter, or transceiver configured for communications for short range to long range communications using now known or later developed communications protocols and associated devices and equipment. For example, the communications module and associated components may be selected and configured for bluetooth communication, or WLAN, WPA, WEP, Wi-Fi, and wireless broadband. For example, In an embodiment, systems may be configured for remote control and monitoring using, among other things, 5G wireless communications.

Figure 16B:
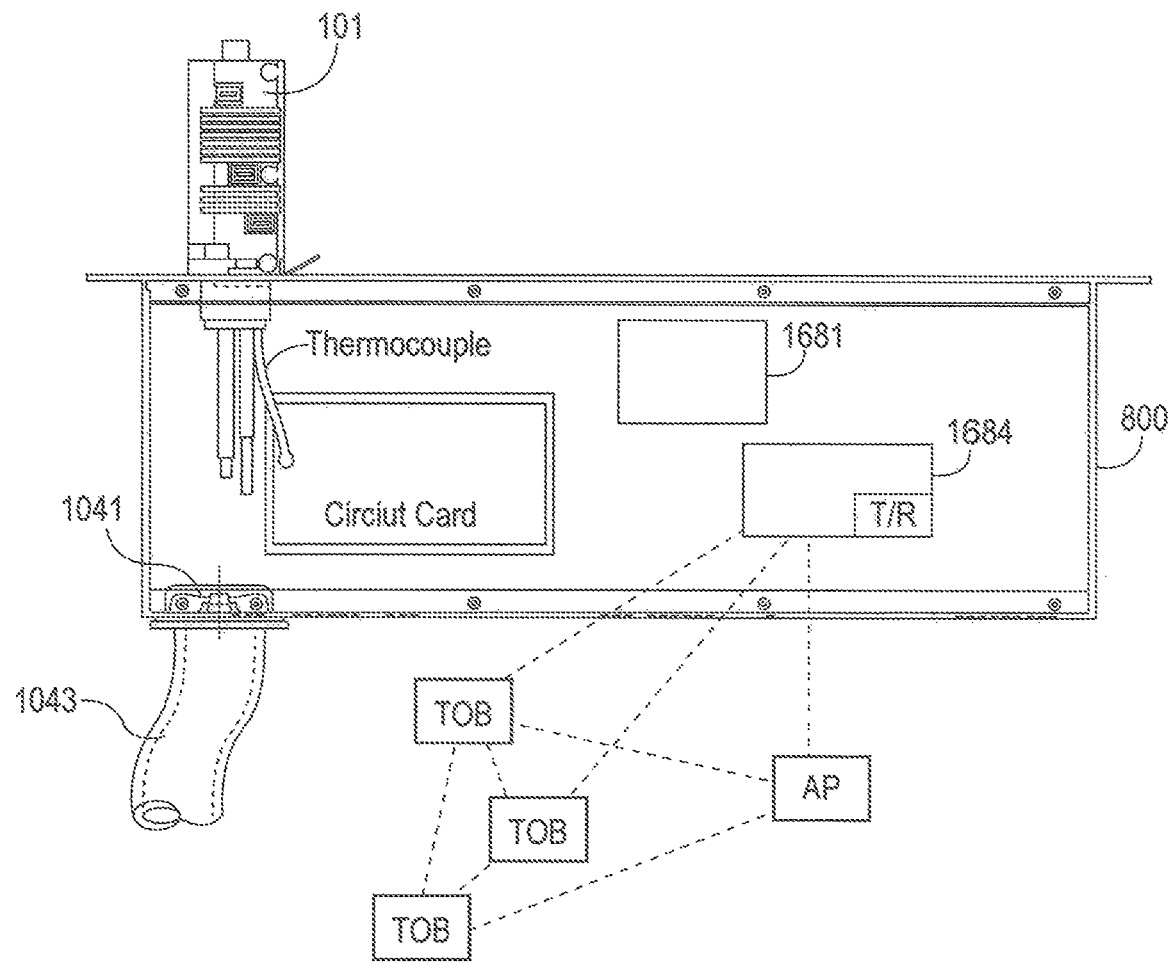
Figure 17A:
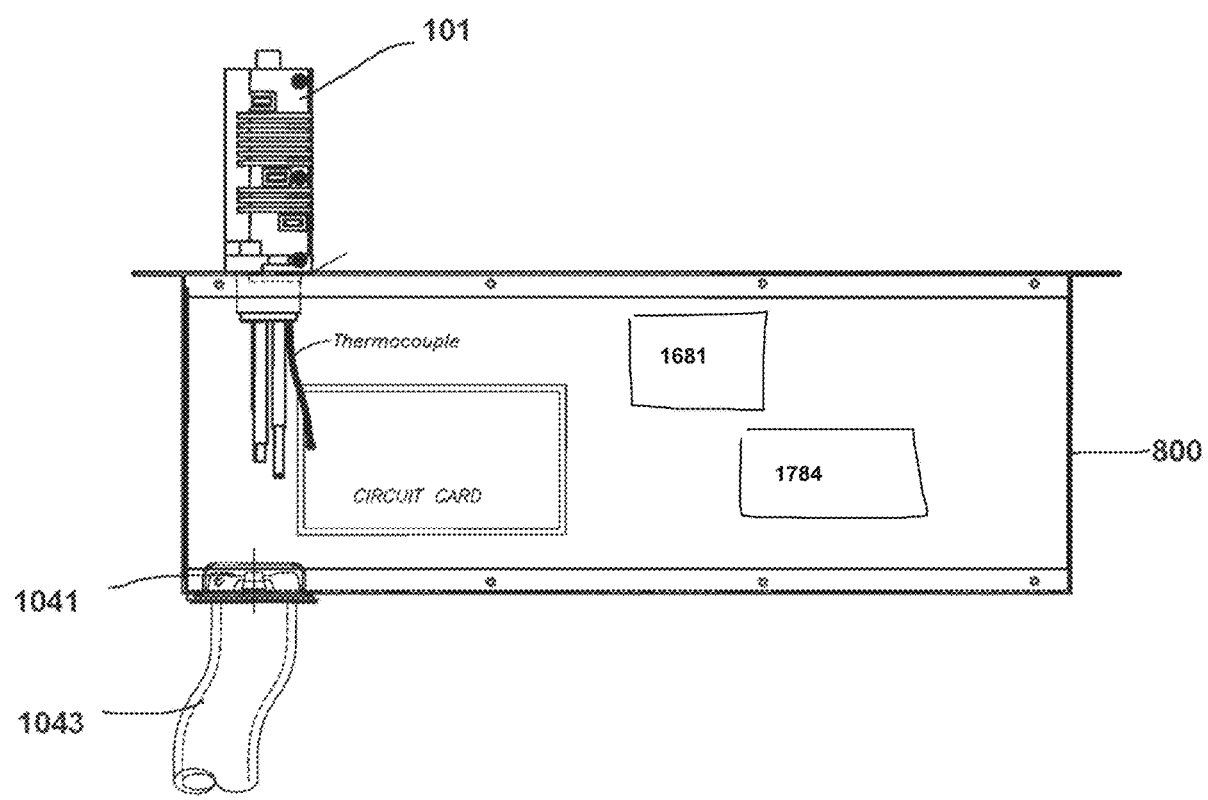
FIG. 17A shows a an embodiment of a remotely controllable tap-off box.
Figure 17B:
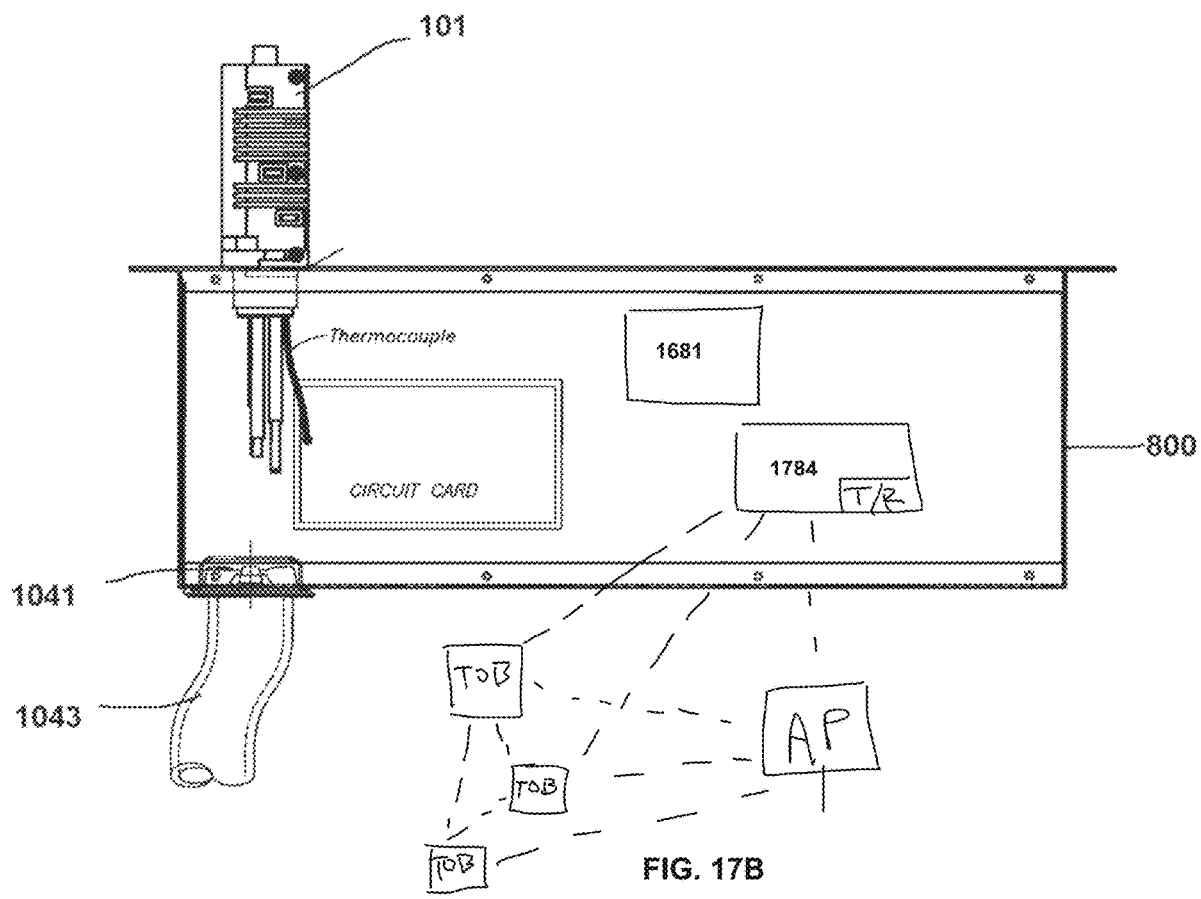
FIG. 17B shows a an embodiment of a remotely controllable networked tap-off box system.

As shown in FIG. 16B, the tap-off box shown in FIG. 16A may be implemented in a tap-off box system network 1686. The system network 1686 may include client tap-off boxes 1788 in networked communication and connected to an access point 1691. The system network may include cell phone networks, wireless local area networks, wireless sensor networks, and satellite communications networks. The client device may itself have a transceiver, and may be configured to form an ad hoc or mesh network with other client device tap-off boxes of the network 1686. Alternatively, or additionally, the network 1686 may include separate repeaters, such as simple transceiver devices, or devices having additional functionality, including routing functionality. Accordingly, remote temperature or other device and condition monitoring and device control is facilitated by the tap-off box system network 1686.

Embodiments are shown by way of example, and not by way of limitation in the figures and drawings.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. A mast head apparatus, comprising:
a mast head enclosure defining a plurality of stab slots and defining a wire access
opening, each of the stab slots of the plurality of stab slots configured to accommodate a stab operably configured for and connected to a wire having at least a diameter corresponding to American Wire Gauge (AWG) #6, and the wire access opening having a diameter of one inch or larger.

2. The apparatus of claim 1, comprising:
a output box having an interior connected to the interior of the mast head by the wire access opening, the output box defining top openings for communicating with a busway channel.

3. The apparatus of claim 1, the wire size comprising a AWG #4 wire size.

4. The apparatus of claim 1, comprising:
a controller and a communications module together configured for remote monitoring and control of the apparatus; and an access point geographically remotely located with respect to the apparatus and configured to access a communications network to which the apparatus is connected for remote control and monitoring of the apparatus.

5. The apparatus of claim 1, the wire access opening further comprising a diameter of one inch.

6. The apparatus of claim 1, the wire access opening further comprising a diameter of greater than one inch.

* * * * *